United States Patent
Cavins et al.

(10) Patent No.: US 6,844,588 B2
(45) Date of Patent: Jan. 18, 2005

(54) NON-VOLATILE MEMORY

(75) Inventors: Craig A. Cavins, Pflugerville, TX (US); Ko-Min Chang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/025,292

(22) Filed: Dec. 19, 2001

(65) Prior Publication Data

US 2003/0111672 A1 Jun. 19, 2003

(51) Int. Cl.[7] ............................................. H01L 29/792
(52) U.S. Cl. ...................... 257/324; 257/315; 257/321; 257/510; 257/544; 365/185.06; 365/185.18
(58) Field of Search ................................. 257/315, 321, 257/324, 506, 510, 544; 365/185.05, 185.06, 185.18; 438/257

(56) References Cited

U.S. PATENT DOCUMENTS

| | | | |
|---|---|---|---|
| 4,769,787 A | | 9/1988 | Furusawa et al. |
| RE35,356 E | * | 10/1996 | Gill .............................. 257/316 |
| 5,621,233 A | * | 4/1997 | Sharma et al. ............... 257/316 |
| 5,679,591 A | * | 10/1997 | Lin et al. ..................... 438/257 |
| 5,789,776 A | | 8/1998 | Lancaster et al. |
| 5,859,459 A | * | 1/1999 | Ikeda ........................... 257/374 |
| 6,005,270 A | * | 12/1999 | Noguchi ....................... 257/315 |
| 6,091,101 A | * | 7/2000 | Wang ........................... 257/315 |
| 6,143,607 A | * | 11/2000 | Chi .............................. 438/257 |
| 6,198,658 B1 | * | 3/2001 | Yoon et al. ............. 365/185.05 |
| 6,431,915 B1 | * | 8/2002 | Ko .............................. 438/257 |
| 6,438,030 B1 | * | 8/2002 | Hu et al. ............... 365/185.18 |
| 6,531,360 B2 | * | 3/2003 | Lee ............................. 438/257 |

OTHER PUBLICATIONS

Y. Hisamune et al., A 3.6 um2 Memory Cell Structure for 16MB EPROMS, 1989, IEEE, IEDM, pp. 583–586.*

* cited by examiner

*Primary Examiner*—George Eckert
(74) *Attorney, Agent, or Firm*—Kim-Marie Vo

(57) ABSTRACT

A semiconductor device includes a non-volatile memory, such as an electrically erasable programmable read only memory (EEPROM) array of memory cells. The memory is arranged as an array of cells in rows and columns. Each column of the array is located within an isolated well, common to the cells in the column but isolated from other wells of other columns. The array is programmed by pulsing potentials to each column, with isolation of results for each column. In one embodiment, the memory cells are devoid of floating gate devices and use a non-conductive charge storage layer to store charges. In another embodiment, the memory cells store charges in nanocrystals.

8 Claims, 11 Drawing Sheets

NON-VOLATILE MEMORY

RELATED APPLICATION

This is related to U.S. Pat. No. 6,438,030 filed Aug. 15, 2000, and entitled "Non-Volatile Memory, Method of Manufacture and Method of Programming" and is assigned to the current assignee hereof.

FIELD OF THE INVENTION

The present invention relates generally to semiconductor devices and, more particularly, to non-volatile memories and isolated channel programming and array operation.

RELATED ART

Conventional memory arrays, such as an electrically erasable programmable read only memory (EEPROM) array, comprise pluralities of individual memory cells. The memory cells can be programmed for desired logic or memory states. In programming the array, each cell must have either a high or low voltage (i.e., on or off) state. The high voltage state that is desirable is limited by power consumption considerations and physical and materials constraints. The low voltage state that is desirable is likewise limited because it must be differentiated from the high voltage state and, yet, it must not result in cross leakage among neighboring cells in tight memory array cell distributions. The higher the voltage required for accessing the low states, the greater the power consumed by the memory cells.

Conventionally, memory cells are distributed in an array. A simplified example of such an array is shown in FIG. 1. The example array in FIG. 1 includes only nine individual memory cells, whereas typical memory arrays include many more cells. The small number of cells in the example array of FIG. 1 is, therefore, to be understood as merely exemplary for purposes of illustration and discussion herein. In practice, the same principles described herein are applicable to memory arrays of widely varying size, including much larger arrays of memory cells.

The array of FIG. 1 includes individual memory cells, for example, memory cells 101–109. Each cell of the array, such as, for example, cell 101, is connected with a wordline at its gate, such as wordline ($W_1$) 121 connected to cell 101 at its gate. Other cells 102 and 103, for example, are also connected to the wordline 121. For reference purposes in FIG. 1, the cells 101, 102, 103 are distributed within the array in a common "row". Common wordlines, such as wordlines ($W_1$) 121, ($W_2$) 122, and ($W_3$) 123, connect cells in common rows, such as cells 101, 102, 103, and 104, 105, 106, and 107, 108, 109, respectively.

A drain of each cell of the row is connected to a separate bitline, for example, the drain of cell 101 is connected to bitline ($B_1$) 131. The same bitline 131 connects with other cells 104 and 107, for example, of the array. For reference purposes, the cells 101, 104, 107 are distributed in a common "column" of the array. Common bitlines, such as bitlines 131, 132, and 133, connect cells 101, 104, 107 and 102, 105, 108 and 103, 106, 109, respectively, in common columns.

A source of the cell 101 is connected to a source line 125. This source line 125 also connects the source of all other cells 101–109 of the entire array. Thus, it can be understood in FIG. 1, that respective ones of the parallel wordlines 121–123 connect the gate of each of the cells 101–103, 104–106, or 107–109, respectively, distributed in common rows of the array, and whereas respective ones of the parallel bitlines 131–133 connect the drain of each of the cells 101, 104, 107, or 102, 105, 108, or 103, 106, 109, respectively, distributed in common columns of the array. All cells 101–109 of the array are situated in a common well, for instance, a p-well 100 of FIG. 1. In this arrangement, each of the source line 125 and the p-well 100 are common to each of the cells 101–109 of the array.

In programming the foregoing array of cells 101–109, a positive voltage is applied to selected memory cell wordlines and to the selected memory cells bitlines. The selected memory cells are subsequently programmed via hot carrier injection (HCI) thereby altering the threshold voltage of selected memory cells (i.e. altering the amount of charge stored in their floating gates). The change in threshold voltage is periodically sensed during the programming event to detect whether or not a targeted threshold voltage has been achieved for all selected memory cells in the array.

In erasing the foregoing array of cells 101–109, the entire array is erased by applying a negative voltage to each wordline and a positive voltage to either the source line 125 or to the common p-well 100. In this manner, the floating gates for all memory cells in the array will correspondingly be charged the low threshold voltage state, simultaneously.

Referring to FIG. 2, a plot illustrates threshold voltage among bits represented by memory cells 101–109 of the array under a high threshold voltage state and low threshold voltage state, i.e., corresponding to "off" or "on" states. It is notable that each of the high voltage state and the low voltage state is actually a range of voltage levels in the vicinity of a particular target high voltage and target low voltage, respectively. The ranges of voltage exhibited in FIG. 2 are illustrative of the type of distribution that is exhibited on programming of the conventional array in which all cells share a common well, such as p-well 100. In the distribution of FIG. 2, high threshold voltages are concentrated in a relatively narrow distribution between, for example, 5 to 6 volts. However, the threshold voltage distribution will be much broader for the low threshold voltage state, such as 0.5 volts to 2.5 volts. This broader threshold voltage distribution at the lower threshold voltage state results mainly because all memory cells are erased at the same time as a result of the common p-well in which all the bit cells are located. The process variation, materials defects, and degradation of material properties are all major causes of this broader Vt distribution at the lower threshold state in comparison with the higher threshold state. The wider Vt distribution leads to the requirement of high wordline voltage during read operations, to ensure success of read access of the low $V_t$ state bit cells.

The problems presented include that substantial power is consumed by the requirement of higher wordline voltage to assure achievement of the read access of the low threshold state. Furthermore, to achieve higher wordline voltage, a boost from a low voltage power supply can be required in order to achieve the desired wordline voltage. To reach the desired wordline voltage, even with the boost from the low voltage power supply, can typically require significant amounts of time because of slow boosting if only low power is employed. It would be an advantage to control the voltage range distributions among cell arrays at the lower threshold voltage levels, in order to reduce the required wordline voltage for read access. Controlling the lower voltage range distributions, however, can lead to problems of cross leakage among neighboring cells when all cells of the array are located in a common p-well.

The present invention is a significant improvement and advantage in the art and technology because it provides for limiting lower threshold voltage distributions to a narrower range and further enables faster access by using lower wordline voltage.

BRIEF DESCRIPTION OF DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

In accordance with one embodiment, a non-volatile memory (NVM) array, such as an electrically-erasable-programmable-read-only-memory (EEPROM) array, includes columns of memory cells formed in separate p-well regions to reduce the programmed threshold voltage distribution width for selected memory cells in the array. The EEPROM array can have memory cells that are devoid of a floating gate, such as SONOS (semiconductor-oxide-nitride-oxide-semiconductor), SNOS (semiconductor-nitride-oxide-semiconductor), MONOS (metal-oxide-nitride-oxide-semiconductor) and MNOS (metal-nitride-oxide-semiconductor) or utilize a floating gate. Additionally, the EEPROM array can include a NVM device that uses discrete storage elements or nanocrystals to store the charge or any other NVM device.

In another embodiment, a plurality of memory cells sharing a common bitline are formed within a well region, such as a p-well region. In one embodiment, each isolated p-well forms a column of memory cells in the array. The p-wells are electrically isolated from each other using shallow trench isolation (STI) structures. The memory cells formed within the separate p-well regions share a common bitline and a common source line. Isolating the memory array into separate p-wells provides improved programming control by allowing the memory cells in the array to be programmed to within a tighter threshold voltage distribution.

Figure 1:
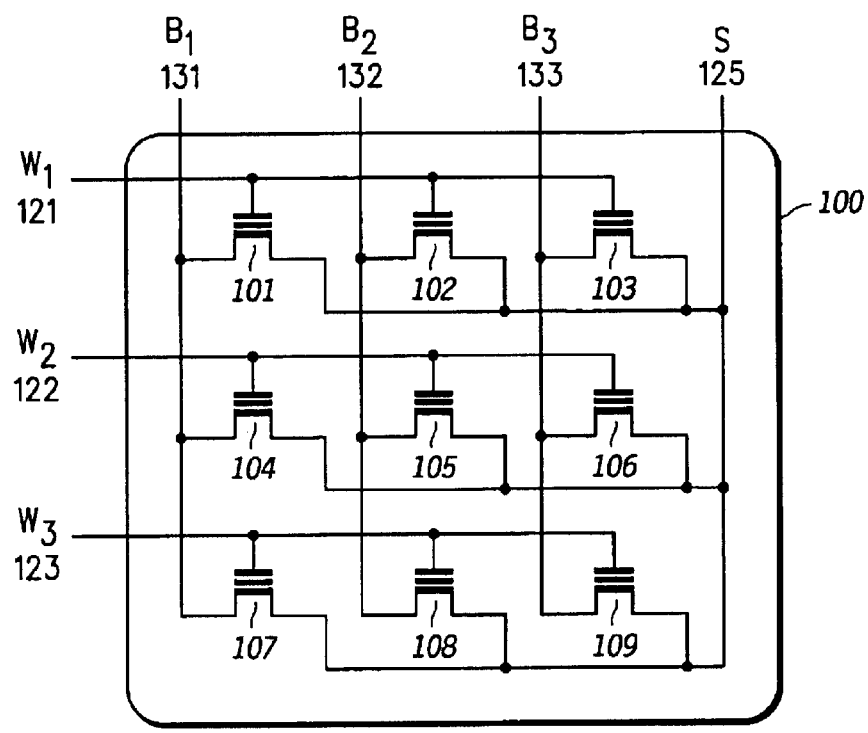
FIG. 1 includes an illustration of a conventional memory cell array configured in a common p-well.
Figure 2:
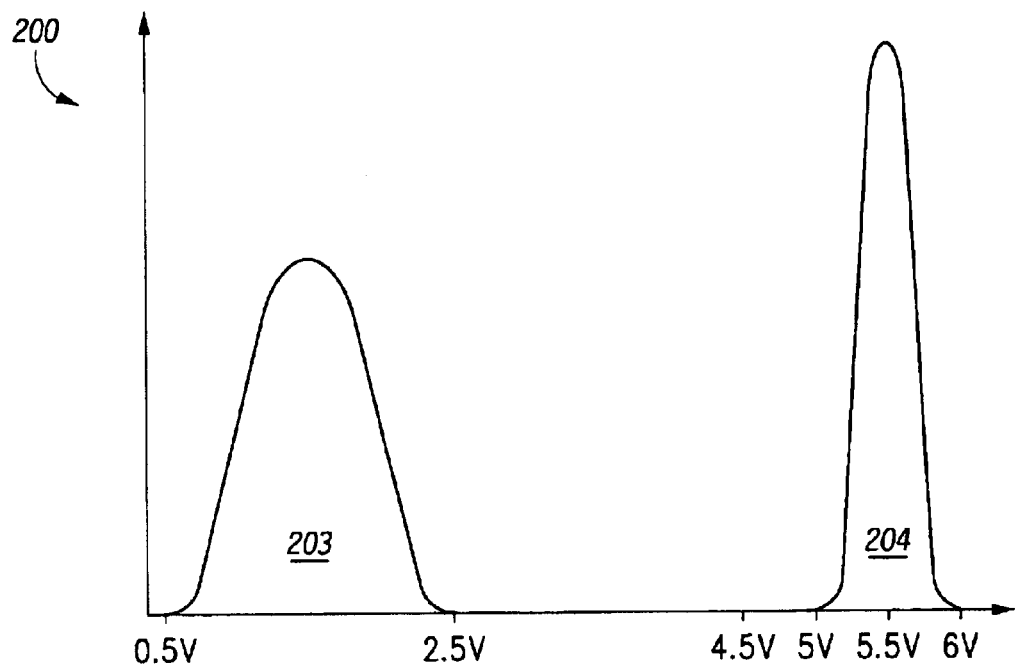
FIG. 2 includes an illustration of voltage distributions of gate electrodes of memory cells of an array at a low voltage threshold level and a high voltage threshold level.
Figure 3:
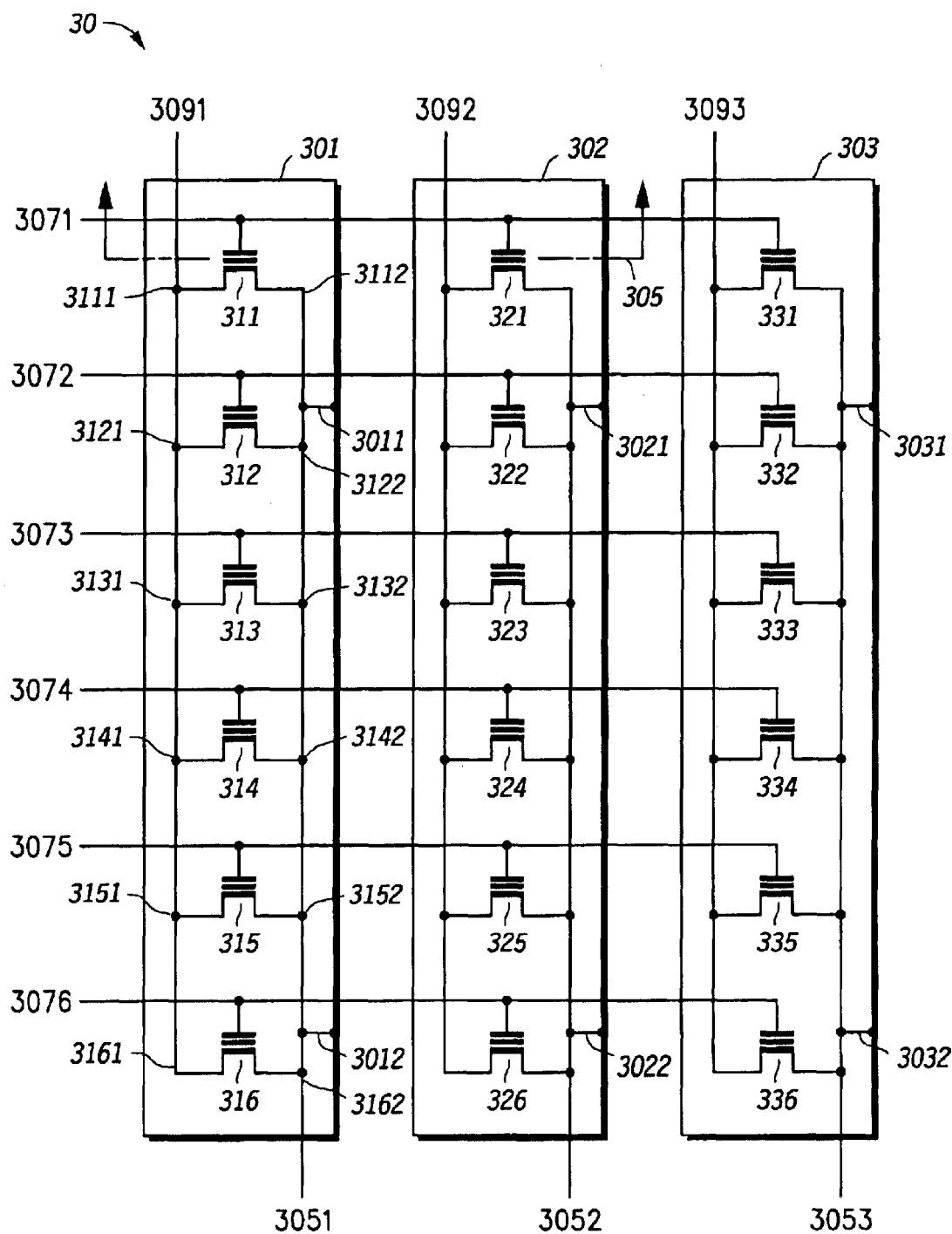
FIG. 3 includes an illustration of isolated p-wells for individual bitlines and memory cells of an array, according to embodiments of the present invention.

Referring to FIG. 3, a memory cell array 30 includes memory cells 311–316, 321–326, and 331–336. The memory cell array 30 is intended as exemplary in that the array can include more or less individual memory cells than those shown, and the cells can be distributed in any of a wide variety of arrangements of common rows, common columns, or other relative location. In the array, memory cells 311–316 form a first column, memory cells 321–326 form a second column, and memory cells 331–336 form a third column.

The memory cells of each column are connected at their respective drains (or drain regions) by a common bitline, for example, memory cells 311–316 are connected by bitline 3091, memory cells 321–326 are connected by bitline 3092, and memory cells 331–336 are connected by bitline 3093. Corresponding cells in adjacent columns, such as memory cells 311, 321, 331, are each connected at a control gate thereof by a common wordline, for example, wordline 3071 connects the control gate of each of the memory cells 311, 321, 331, wordline 3072 connects the control gate of each of the memory cells 312, 322, 332, wordline 3073 connects the control gate of each of the memory cells 313, 323, 333, wordline 3074 connects the control gate of each of the memory cells 314, 324, 334, wordline 3075 connects the control gate of each of the memory cells 315, 325, 335, and wordline 3076 connects the control gate of each of the memory cells 316, 326, 336. In accordance with one embodiment, each column of memory cells, for example, memory cells 311–316, is situated within a common well, such as, p-well 301. Memory cells 321–326 are situated in p-well 302, and memory cells 331–336 are situated in p-well 303. Each column of memory cells is electrically isolated from neighboring columns of memory cells via a shallow trench isolation structure (not shown in FIG. 3).

A source line electrically couples to source regions of each of the memory cells of the respective column, such as cells 311–316 of the first column are connected to the source line 3051. In accordance with one embodiment, the source line 3051 and the p-well region 301 are electrically coupled so as to have an equivalent voltage, as indicated by electrical ties (or straps) 3011 and 3012. Other isolated p-wells 302, 303 of the array 30 include columns of cells 321–326 or 331–336, respectively, and the source regions for the memory cells 321–326 or 331–336 are electrically coupled to the source lines 3052 or 3053. The connections 3021, 3022 and 3031, 3032 respectively indicate electrical coupling, and therefore equivalent voltages, of source line 3052 and p-well 302, on the one hand, and source line 3053 and p-well 303, on the other hand. Although the connection of the source line 3051 and p-well 301 are indicated in FIG. 3 as occurring every four cells, i.e., at connections 3011, 3012 on either side of the sequence of memory cells 312–315, this sequence and number of memory cells between the connections is merely exemplary and any of a wide variety of memory cell sequences can intercede between connections 3011 and 3012, 3021 and 3022, and 3031 and 3032, respectively. For example, the connections can occur as desired between every 16 cells, 32 cells, 64 cells, or otherwise depending on the array, its makeup, and the desired arrangement.

The connections provided by the straps, such as 3011 and 3012, help to ensure that the p-well potential remains stable during the read and write operations. Typically, the depth of the p-well does not exceed the depth of the shallow trench isolation structures. Therefore, the sheet resistance of the p-well regions will typically increase as the depth of the shallow trench isolation structures decrease. This can result in instability of the p-well's potential if there is any leakage current in the p-well. An unstable p-well potential can correspondingly produce undesirable threshold voltage instability. Therefore, the straps, such as 3011 and 3012, help to ensure the potential applied to the source line (and p-well) is equally distributed throughout the p-well region, thereby improving the threshold voltage stability of the memory cells in the p-well.

Figure 4:
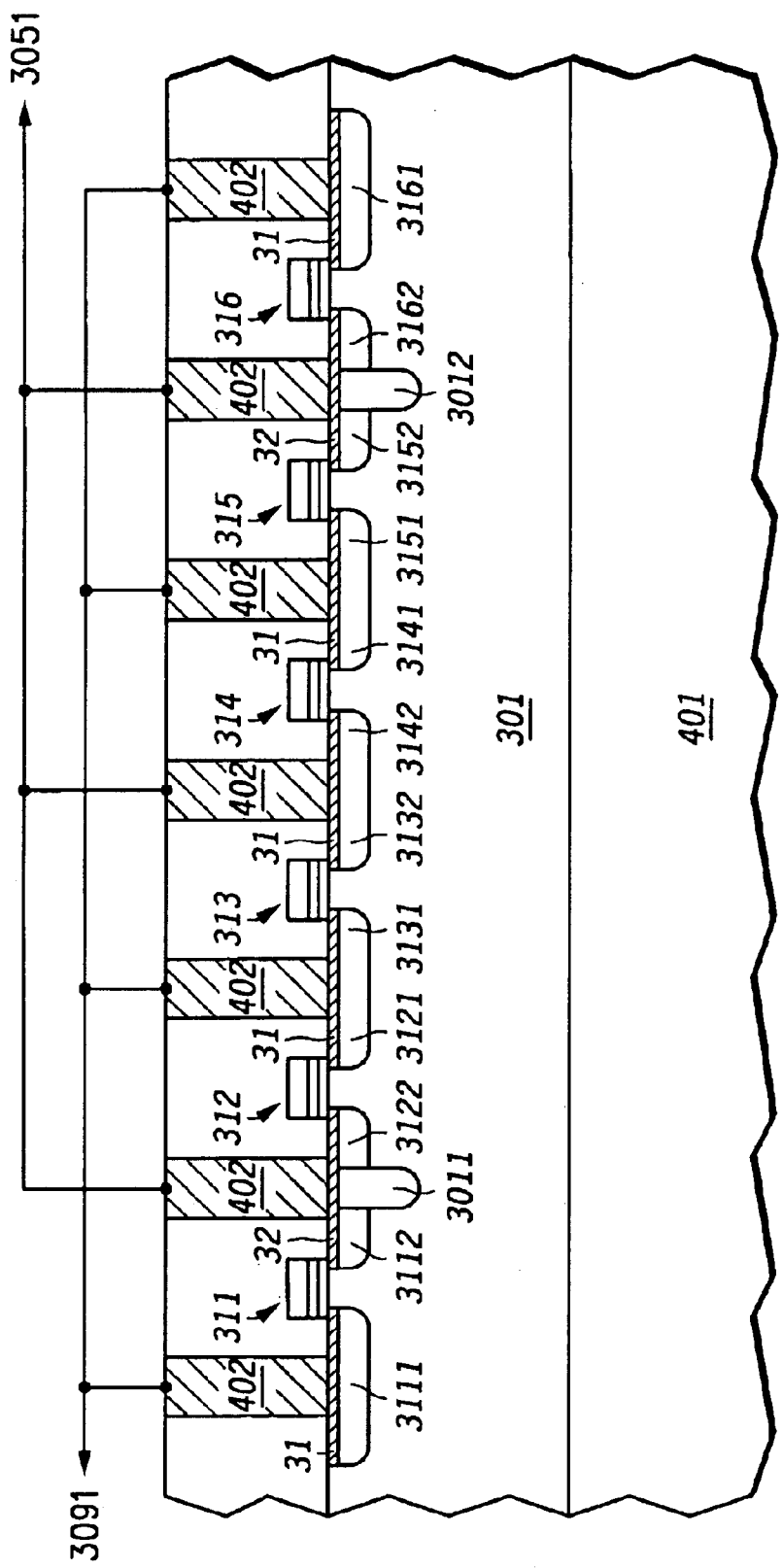
FIG. 4 includes an illustration of a cross sectional view of a semiconductor device, along a length of an isolated p-well of the array of FIG. 3.

Referring to FIG. 4, a semiconductor device cross-section comprising the array of FIG. 3 and includes the p-well 301 formed within a deep n-well 401. Memory cell source regions and drain regions are connected, via conductive plugs 402, with the source line 3051 and the bitline 3091, respectively. The source regions include the diffusion regions 3112, 3122 and 3132 and 3142 and 3152, 3162. The drain regions include the diffusion regions 3111 and 3121, 3131 and 3141, 3151 and 3161. The source to p-well straps include the p-doped regions 3011 and 3012. In accordance with one embodiment, the selected source regions are electrically shorted to the p-well straps by siliciding portions of the semiconductor substrate overlying the selected source regions 3112, 3122, 3152, and 3162 and the p-well straps 3011 and 3012 as shown by silicided regions 32. In alternative embodiments the p-well region 301 can be electrically tied to the selected source regions by siliciding the selected source regions to the extent that they directly short to the p-well region, or alternatively by overetching the contact opening for the selected source region conductive plugs to the extent that the conductive plug electrically shorts the selective source region and the p-well region.

As shown in FIG. 4, The respective source and drain regions are separated by the channel regions of the memory cell's 311, 312, 313, 314, 315, and 316. In accordance with one embodiment, the memory cells comprise a tunnel oxide over the channel region, a floating gate electrode over the tunnel oxide, a control gate dielectric over the floating gate electrode, and a control gate electrode over the control gate dielectric. Conductive plugs 402 and interconnects (not shown) connect the respective source and drain regions with electrical signals from, either the bitline 3091 in the case of the drain regions or the source line 3051 in the case of the source regions. Although the bitline 3091 and the source line 3051 are indicated schematically in FIG. 4 as electrical wires, it should be understood that appropriate semiconductor interconnections are made at a same or different levels of the device to form the respective bitline 3091 and source line 3051, and the illustration with electrical wires is merely intended for explanation and understanding of the electrical conductive effect of the connections and arrangement.

Figure 5:
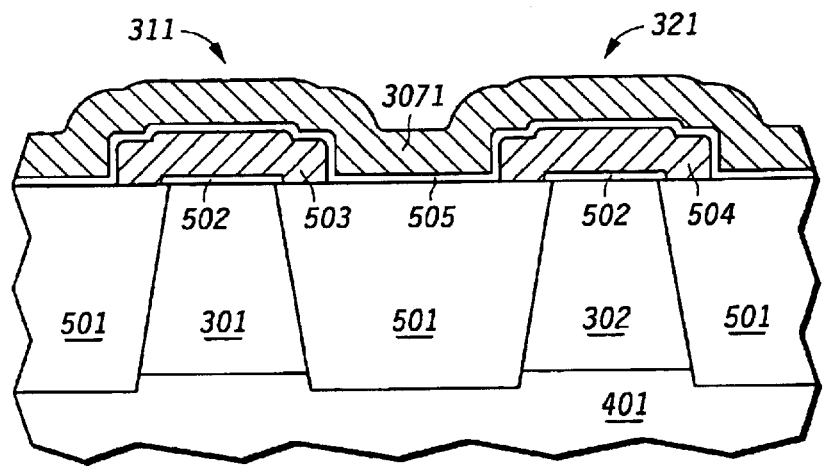
FIG. 5 includes an illustration of a cross sectional view of a semiconductor device across adjacent cells of respective neighboring isolated p-wells of FIG. 3.

Referring to FIG. 5, the semiconductor device of FIG. 4, having the electrical configuration of the array 30 of FIG. 3, is shown in cross-section taken across adjacent p-wells 301 and 302 substantially along sectioning line 305. In accordance with one embodiment, a deep n-well region 401 is formed within a semiconductor device substrate and the columns of p-wells used to form the array of memory cells is disposed within the deep n-well region. As shown in the cross section of FIG. 5, shallow trench isolation structures 501 and deep n-well region 401 electrically isolate p-well regions 301 and 302. Memory cells 311 and 321 overlie the p-well regions 301 and 302, respectively. The memory cells 311 and 321 comprise a tunnel oxide 502, floating gate electrodes 503 and 504, a control gate dielectric layer 505 and control gates formed from portions of the wordline 3071 of FIG. 3. In addition, the wordline 3071 interconnects the memory cells 311 and 321.

As is apparent from the cross-section of FIG. 5, the p-well 301 is isolated from the p-well 302. It is understandable that, because of the isolation, biasing potentials of memory cells associated with p-well 301 are not necessarily the same as, and can be independent of, biasing potentials of memory cells associated with the p-well 302. In other words, each separate p-well column is electrically isolated from other p-well columns in the array 30. As will be hereinafter more fully understood, these isolated p-wells enable array programming in such manner as to achieve narrower distribution of threshold voltages, both at the low and the high threshold voltage levels. The isolated p-wells furthermore provide certain other advantages, including reducing chances of cross-over leakage among neighboring cells, that will also hereinafter be more fully understood.

Figure 6:
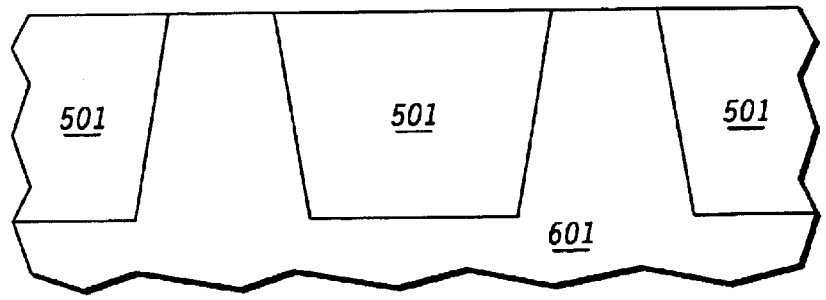
FIG. 6 includes an illustration of a cross section of a semiconductor device work piece having the orientation of FIG. 5, showing trench formation for the neighboring isolated p-wells.

Referring to FIGS. 6–9, steps associated with the formation of the device of FIG. 5 are more fully described. Shown in FIG. 6 is a semiconductor device substrate 601. The semiconductor device substrate 601 can be a monocrystalline semiconductor wafer, a semiconductor on insulator (SOI) substrate, or any other substrate suitable for use to form semiconductor devices. In one specific embodiment, the semiconductor device substrate is a silicon substrate. Isolation structures 501 are formed within the semiconductor device substrate 601. In one specific embodiment, the isolation structures 501 are shallow trench isolation structures. Alternatively, the isolation structures 501 can include local oxidation of silicon (LOCOS) structures or other isolation structures as known to one of ordinary skill. The shallow trench isolation structures 501 serve to isolate p-well regions subsequently formed within the substrate 601. In one embodiment, the shallow trench isolation structures have a depth that is in a range of approximately 0.35 to 0.65 microns deep or alternatively, such other depth and parameters as are appropriate for the application.

Figure 7:
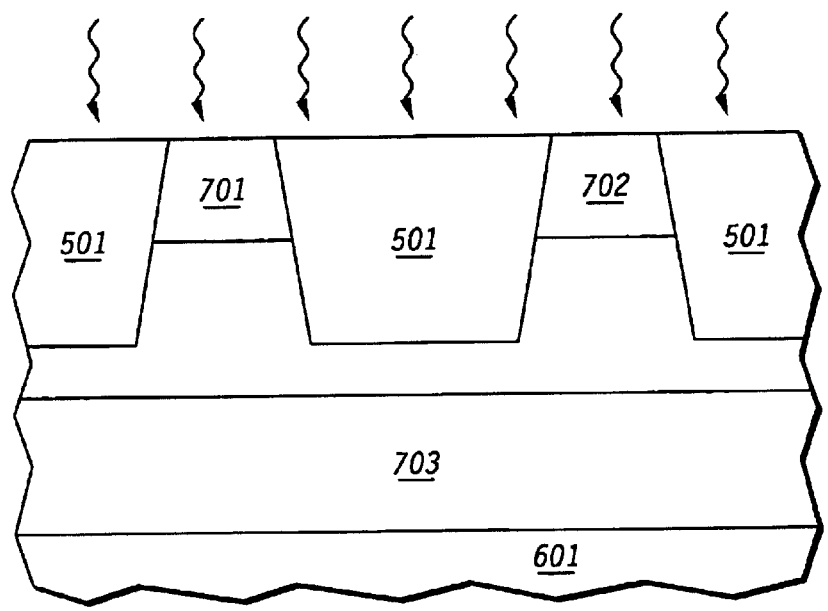
FIG. 7 includes an illustration of p-well and deep n-well isolation implantation of the device of FIG. 6.

Referring to FIG. 7, after formation of the shallow trench isolation structures 501, a p-well implant is performed to form doped regions 701 and 702 within the substrate 601. In accordance with one embodiment, the substrate 601 is implanted using boron or other p-type dopants to form the p-doped regions 701 and 702. After forming the p-doped regions 701 and 702 the substrate 601 is again implanted with phosphorus or other n-type dopants to form the deep n-doped region 703. One of ordinary skill in the art recognizes that the implant energy used to form the deep doped region 703 is higher as compared to the implant energy used to form the doped regions 701 and 702.

Figure 8:
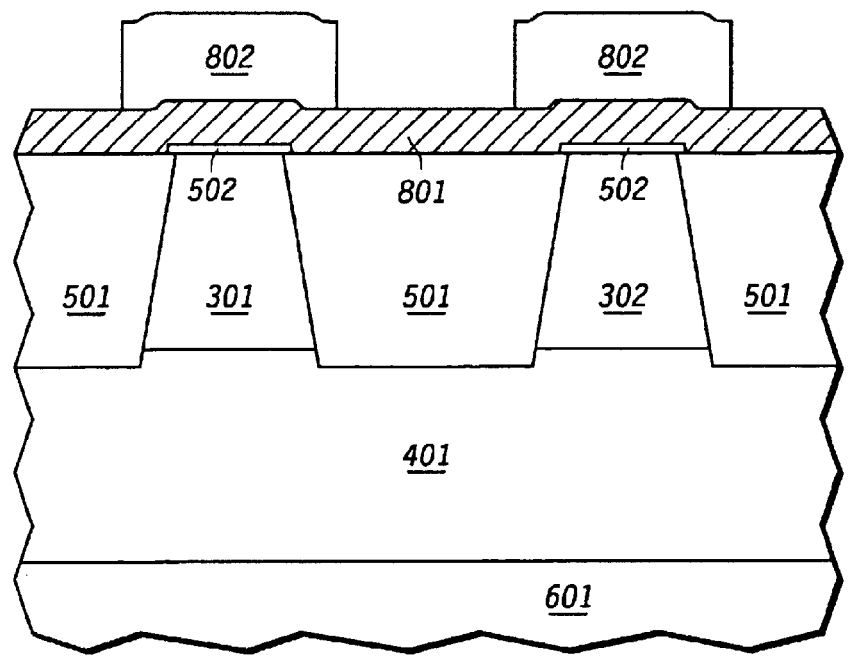
FIG. 8 includes an illustration of deep n-well isolation and diffusion of p-well in the n-well, followed with gate oxide formation and poly deposition and patterning, of the device of FIG. 7.

After forming the p-type doped regions 701 and 702 and the deep n-type doped region 703, a tunnel oxide 502 is formed over the substrate surface as shown in FIG. 8. (Note, when used in this context "substrate surface" includes the semiconductor device substrate as well as all layers fabricated on the semiconductor device substrate up to the point of processing under discussion. Therefore, substrate surface refers to the present uppermost surface of the substrate, including all structures formed thereon). In accordance with one embodiment, the tunnel oxide is a thermally grown silicon dioxide layer. Alternatively the tunnel oxide can include a high dielectric constant material or a combination of thermally grown silicon dioxide and high dielectric constant materials (for the purposes of this specification a high dielectric constant (high-k) material is a material having a dielectric constant greater than that of silicon dioxide.

In accordance with one embodiment, the semiconductor substrate is then annealed using conventional annealing processes to diffuse and activate the dopants in the substrate 601 (i.e. the p-type regions 701 and 702 and the deep n-type region 703) thereby forming the p-well regions 301 and 302 and the deep n-well region 401 as shown in FIG. 8. A first conductive layer 801 is then formed overlying the substrate surface. In accordance with one embodiment the first conductive layer 801 a layer of polysilicon. Thereafter, a resist layer is deposited and patterned overlying the first conductive layer 801 as shown in FIG. 8. The first conductive layer 801 and underlying tunnel oxide layer 502 is then etched to form floating gates 503 and 504 as shown in FIG. 9.

Figure 9:
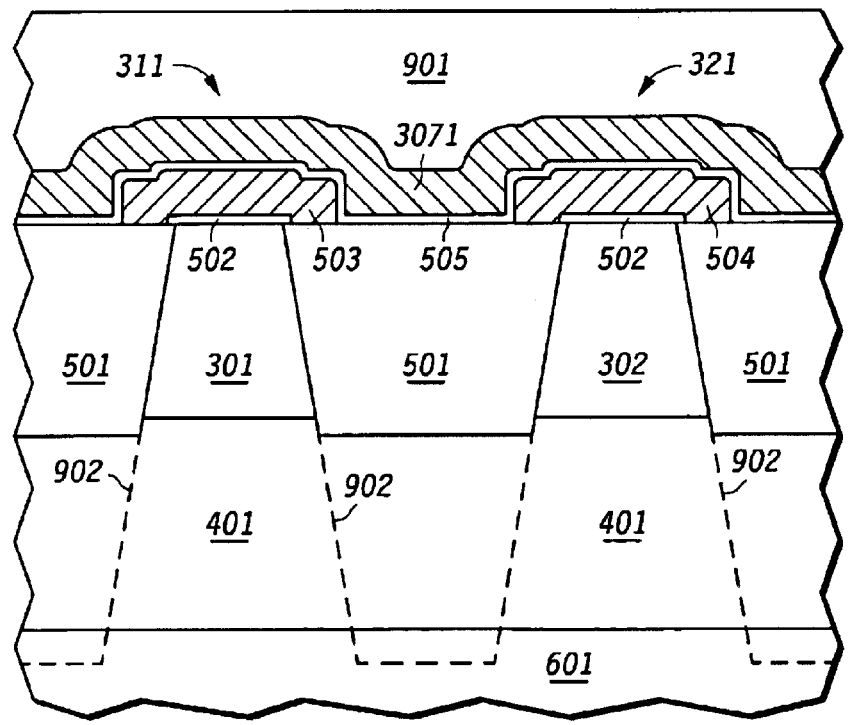
FIG. 9 includes an illustration of remaining poly 1 after etch, followed by an oxide nitride oxide (ONO) layer and poly 2 deposition, of the device of FIG. 8.

Turning now to FIG. 9, after forming the floating gate electrodes 503 and 504, a control gate dielectric layer 505 is formed overlying the floating gate electrodes 503 and 504. In accordance with one embodiment, the control gate dielectric layer 505 is a oxide-nitride-oxide (ONO) layer having an equivalent oxide thickness (EOT) of approximately 10–15 nanometers. Thereafter, a second conductive layer is deposited, patterned and etched as desired to form the wordline 3071, which also forms the control gates for the memory cells 311 and 321. In accordance with one embodiment, the second conductive layer is a layer of polysilicon. The wordline 3071 commonly connects the memory cells 311 and 321 (as also shown in FIG. 3). After the wordline 3071 and other wordlines (not shown) are formed, an interlevel dielectric (ILD) layer 901, such a chemically vapor deposition (CVD) silicon oxide formed using tetraethoxysilane (TEOS) as a source gas, or other similar material, is deposited over the substrate surface. Although not shown in FIG. 9, subsequent steps in formation of the semiconductor device include formation of contacts and interconnects to other elements of the array.

In an alternative embodiment, as technology continues to scale the features sizes of the memory cells, the area of the deep n-well arrangement disclosed with respect to FIGS. 5–9, might be too large and result in a slow down of the charge/discharge time for high voltage write and erase operations. To overcome this, the present inventors have recognized that a deep trench structure can be substituted for the shallow trench isolation, such that the each column is fully isolated with respect to both the p-wells and n-wells. This can advantageously reduce the junction capacitance of the n-well to p-type substrate for each individual bitline, which in turn reduces the charge/discharge time for the write/erase operations. In addition, the p-well depth can be increased by increasing the depth of the trench isolation structures. Increasing the p-well depth can have several advantages. First, it reduces the p-well sheet resistance, which helps to reduce instability of the p-well's potential (as discussed previously). Second, it improves manufacturability of the semiconductor device by reducing the requirement of controlling the boron doping profile in the p-well because the deeper trench isolation structures can reduce the leakage path between adjacent bitlines. Third, the deeper p-wells/trench isolation structures additionally reduce the bipolar action of the n+(source and drain)/p-well/n-well parasitic transistors. The dashed lines 902 of FIG. 9 indicate an example of this deep trench. As shown in FIG. 9, the depth of the deep trench isolation structure extends beyond the depth of the deep n-well region 401. Preferably, the deep trench isolation structure has a depth that is in a range of approximately 0.6–1.1 microns. More preferably, the deep trench isolation structure has a depth that is in a range of approximately 0.8–1.0 microns.

Referring now to FIGS. 10A–E, an embodiment of programming the memory cell array having isolated p-well arrangements is disclosed. Each of the FIGS. 10A–E include an X-Y plot on the left showing threshold voltage ($V_T$) vs. Number of Bits for the memory cells in the array 30 including the three memory cells 311, 321, and 331 of FIG. 3 and a simplified schematic of the memory array 30 of FIG. 3, on the right, showing representative biasing potentials used to program the memory cells. Collectively the FIGS. 10A–E illustrate how embodiments of the present invention (i.e. using isolated p-wells to form columns in the memory array) can be used to program the memory cells in the array to a low threshold voltage state having a tighter $V_T$ distribution as compared to prior art memory arrays. The programming with respect to the three memory cells 311, 321, 331, and the remaining memory cells in the array 30 and the specific biasing potentials are intended to be non-limiting and only for illustrative purposes. One of ordinary skill in the art recognizes that any number of memory cells in the array can be programmed and that other biasing potentials can be used to program the memory cells.

In accordance with one embodiment, changing the threshold voltage of the memory cell from a high threshold voltage state to a low threshold voltage state programs the memory cells. The high and low threshold voltage state each have a range that constitutes their respective threshold voltage target. For example, in the embodiments described herein, the high threshold voltage target is in the range of from about 4.0 volts to about 5.0 volts; the low threshold voltage target is in the range of from about 1.0 volts to about 1.5 volts and a read voltage level is approximately 3.3 volts. It is notable that the low threshold voltage target using embodiments described herein is tighter than previously obtainable with prior art memory arrays. The isolated p-wells allow for separate biasing of memory cells in each of the p-wells. The ability to separately bias the memory cells improves the ability to accurately program the memory cells to within the desired threshold voltage range by providing an ability to deselect memory cells in specific p-wells after a desired threshold voltage for that memory cell is obtained.

Figure 10A:
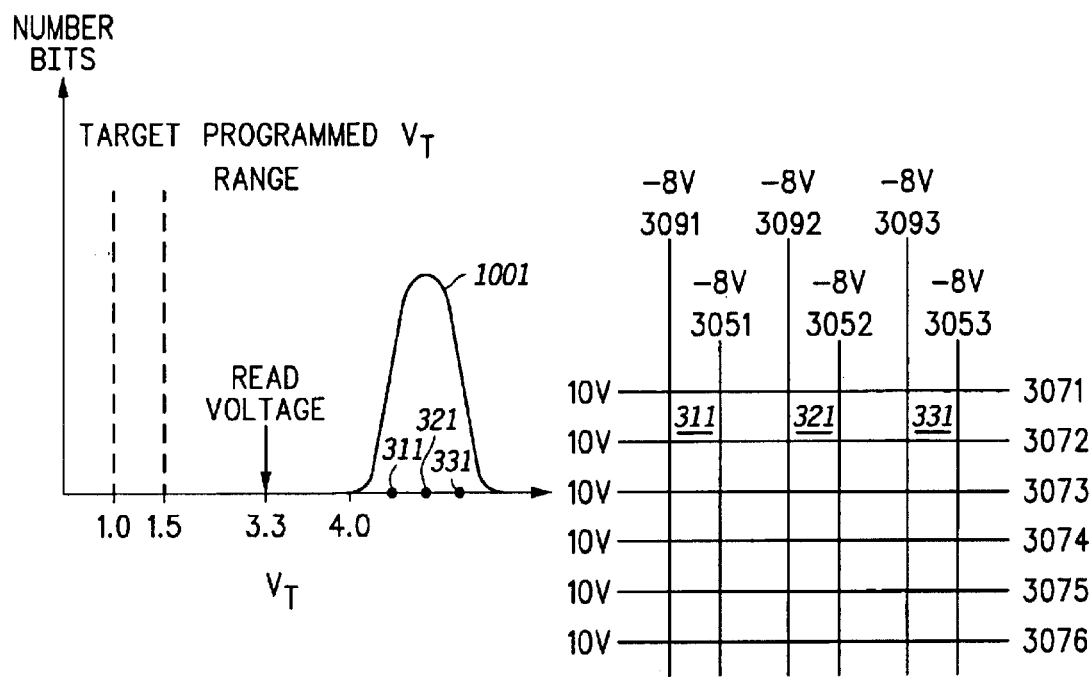
FIGS. 10A–E include illustrations of exemplary voltage stepping with respect to isolated p-wells of an array in erasing and programming the array, with representative gate voltage distributions for memory cells at various step voltages.

Referring to FIG. 10A, the X-Y plot illustrates the threshold voltage distribution for the memory cells in FIG. 3 when erased to a high threshold voltage state. Additionally, a simplified schematic of the memory array 30 of FIG. 3 is provided adjacent the X-Y plot. The simplified schematic indicates the respective voltages applied to the bitlines 3091, 3092, 3093, the source lines 3051, 3052, 3053, and the wordlines 3071–3076. The isolated p-wells 301 302, and 303 (shown in FIG. 3) are biased at the same potential as the respective source line 3051, 3052, and 3053 as a result of connections 3011, 3012 and 3021, 3022 and 3031, 3032. In accordance with one embodiment, as shown in FIG. 10A, prior to programming the memory cells in the array, they are erased via Fowler-Nordheim tunneling by applying a voltage of, for example, −8 volts, to each of the bitlines 3091, 3092, 3093 and source lines 3051, 3052, 3053 and 10 volts to each of the wordlines 3071, 3072, 3073, 3074, 3075, 3076 of the array. The result of this biasing operation erases the memory cells in the array to a high threshold voltage state to a voltage between approximately 4.0–5.0 volts. The threshold voltage distribution is given by the curve 1001. As shown in FIG. 10A, the erased threshold voltages of the memory cells 311, 321, and 331 fall within the distribution of the curve 1001.

Referring to FIGS. 10B–E, after erasing the memory cells to the high threshold voltage state, in accordance with one specific embodiment, the memory cells 311 and 321 are programmed in stepped manner to a low threshold voltage state. One of ordinary skill in the art recognizes that the particular programming sequence for the memory cells 311 and 321 as hereafter described can vary for the memory cells of the array according to the particular threshold voltage state desired. In the example of FIGS. 10A–E, the targeted threshold voltage states for the memory cells in the array are on or programmed (i.e., low voltage threshold state) and off or erased (i.e., high voltage threshold state), respectively.

Figure 10B:
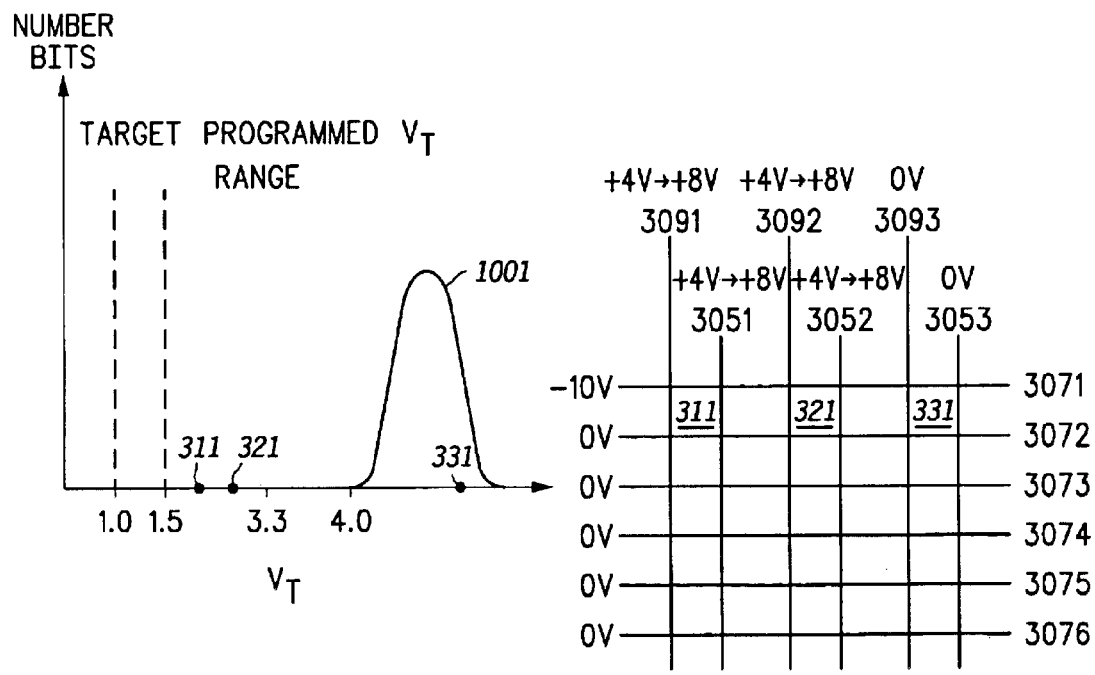

Referring now to the simplified schematic shown in FIG. 10B, after erasing the memory cells in the array as shown in FIG. 10A, the wordline 3071 is biased at approximately −10V and the bitlines 3091 and 3092 and the source lines 3051 and 3052 are incrementally biased from approximately +4 volts toward approximately +8 volts, for example from +4 volts to +5 volts in 0.2 volt increments to remove electron charge from the floating gate of memory cells 311 and 321, thereby reducing the threshold voltage of the memory cells 311 and 321. The wordlines 3072–3076, the bitline 3093, and the source line 3053 are all biased at approximately 0 volts, such that all other memory cells in the array (including memory cell 331) remain erased at a high threshold voltage state. As shown in the X-Y plot of FIG. 10B, the threshold voltage of the memory cells 311 and 321 shifts from within the distribution 1001 toward the Target Programmed $V_T$ Range and the threshold voltage of memory cell 331 remains unchanged, within the distribution 1001.

Figure 10C:
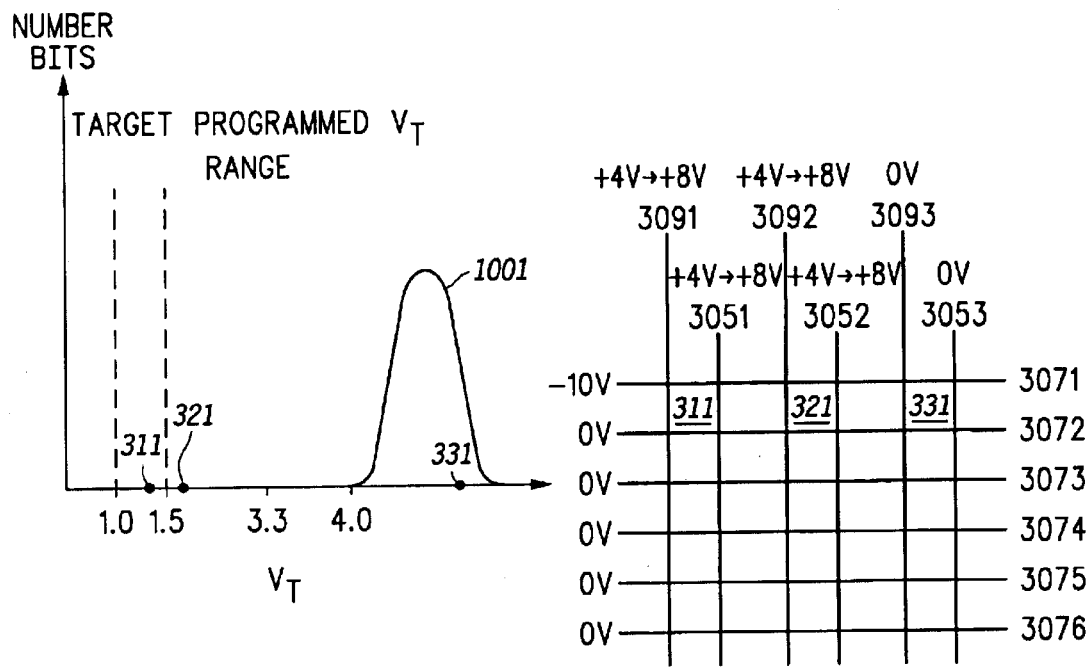

Referring to FIG. 10C, the bias voltages of the bitlines 3091, 3092 and the source lines 3051, 3052 are again increased, for example, from approximately +5 volts to +6 volts, in increments of 0.2 volts, while maintaining the −10 volt bias potential on the wordline 3071. This continues reducing the threshold voltage of the memory cells 311 and 321 as indicated by the relative change in their positions on the X-Y plots between FIG. 10B and 10C. The wordlines 3072–3076, the bitline 3093, and the source line 3053 all continue to be biased at approximately 0 volts, and consequently, the floating gates of the other memory cells in the array including memory cell 331 remain at a high threshold voltage state (i.e. erased). As shown, for example, in the X-Y plot of FIG. 10C, as a result of the biasing operation, the threshold voltage of the memory cell 311 decreases to within the Target Programmed $V_T$ Range and the threshold voltage of the memory cell 321 decreases to a value that is close to but not within the Target Programmed $V_T$ Range.

Figure 10D:
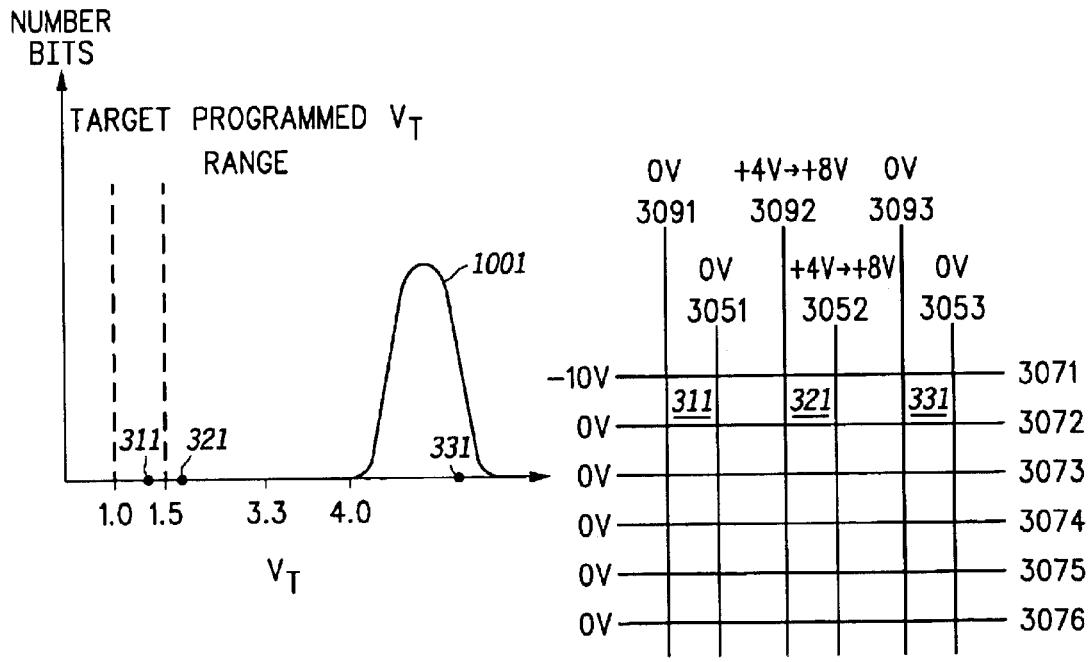

Referring to FIG. 10D, after the threshold voltage of the memory cell 311 decreases to within the Target Programmed $V_T$ Range, bias voltages of bitline 3091 and source line 3051 (and the isolated respective p-well 301 shown in FIG. 3 associated with the source line 3051 as a result of the source line to p-well straps 3011 and 3012) are reduced to 0 volts. This maintains the $V_T$ state of the cell 311 within the desired low $V_T$ range without further change. Because the P-well 301 associated with memory cell 311 is isolated from other p-wells (302 and 303 shown in FIG. 3, for example) in the array, the change in bias voltage (i.e. applying 0 volts) to bitline 3091, source line 3051, and p-well 301 effectively stops the threshold voltage shift for memory cell 311 and maintains the threshold voltage of memory cell 311 within the Target Programmed $V_T$ Range. This is accomplished without affecting the ability to program other memory cells associated with other p-wells in the array, such as in this example memory cell 321 in adjacent the adjacent p-well (p-well 302 shown in FIG. 3).

Figure 10E:
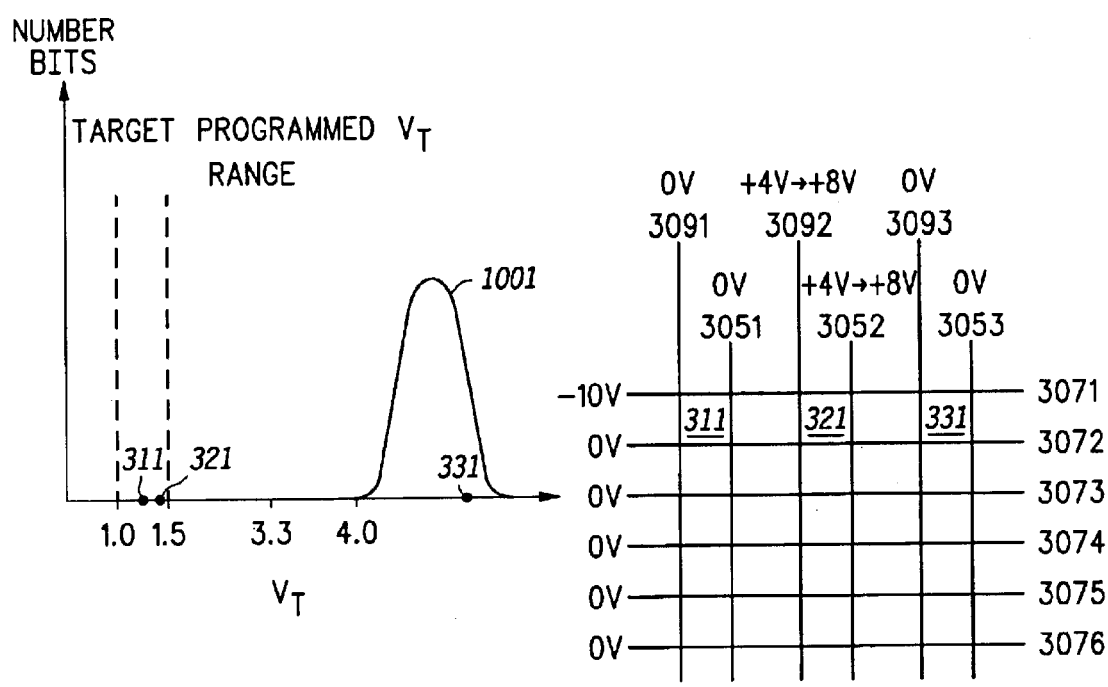

Referring now to FIG. 10E, the bias voltage applied to the bitline 3092 and the source line 3052 continue to be incrementally increased, for example, from approximately +6 volts to +7 volts, in increments of 0.2 volts while maintaining the −10 volt bias potential on the wordline 3071 until the threshold voltage of memory cells 321 is reduced to within the Target Programmed $V_T$ Range as shown in FIG. 10E. It is understandable that, because of the isolated wells of the respective cells 311, 321, 331 in accordance with the embodiments described herein, the cells in each respective isolated well can be programmed to the appropriate threshold voltage state without affecting the threshold voltage state of cells in other neighboring isolated wells. The X-Y plot shown in FIG. 10E shows the threshold voltages of memory cells 311, 321 within the Target Programmed $V_T$ Range and the threshold voltage of memory cell 331 within the range of the high threshold voltage distribution along with the other memory cells in the array. This is the programmed state that is desired for the cells 311, 321, and 331 (and remaining cells in the memory array). Although the foregoing example of programming memory cells of the array of FIG. 3 is specifically described, those skilled in the art will know and understand that other programming steps, bias voltage ranges, processes, etc. can be employed with the array and other arrays and devices, all consistent with the concepts of isolated well regions for the various cells or locations of the array or other device.

The present invention has several advantages over the prior art. The present invention can be used for array architectures to operate the memory array by independently biasing each column channel voltage for channel Fowler-Nordheim tunneling to achieve tight $V_T$ distribution for low voltage/low power and high performance applications. By using Fowler-Nordheim tunneling to program and/or erase through the channel region of the bitcells, high drive current (i.e. hot electron injection) and band-to-band tunneling current (i.e. source/drain edge program/erase) used by the prior art can be avoided. The channel length can be scaled down without high $V_{ds}$ conditions and deep junctions. In addition, erasing to a high threshold voltage state and programming with verify to a low threshold voltage state, depletion bits (i.e. $V_T$ less than or approximately equal to zero volts) due to over-erase to a low $V_T$ state can be avoided. Furthermore, embodiments of the present invention have the advantage of reducing the need to use $V_{dd}$ boosting or charge pumps to boost the wordline voltage during read operation. In addition, embodiments of the present invention can easily be incorporated into current process flows using existing materials and without a need to develop new or elaborate processes.

Figure 11:
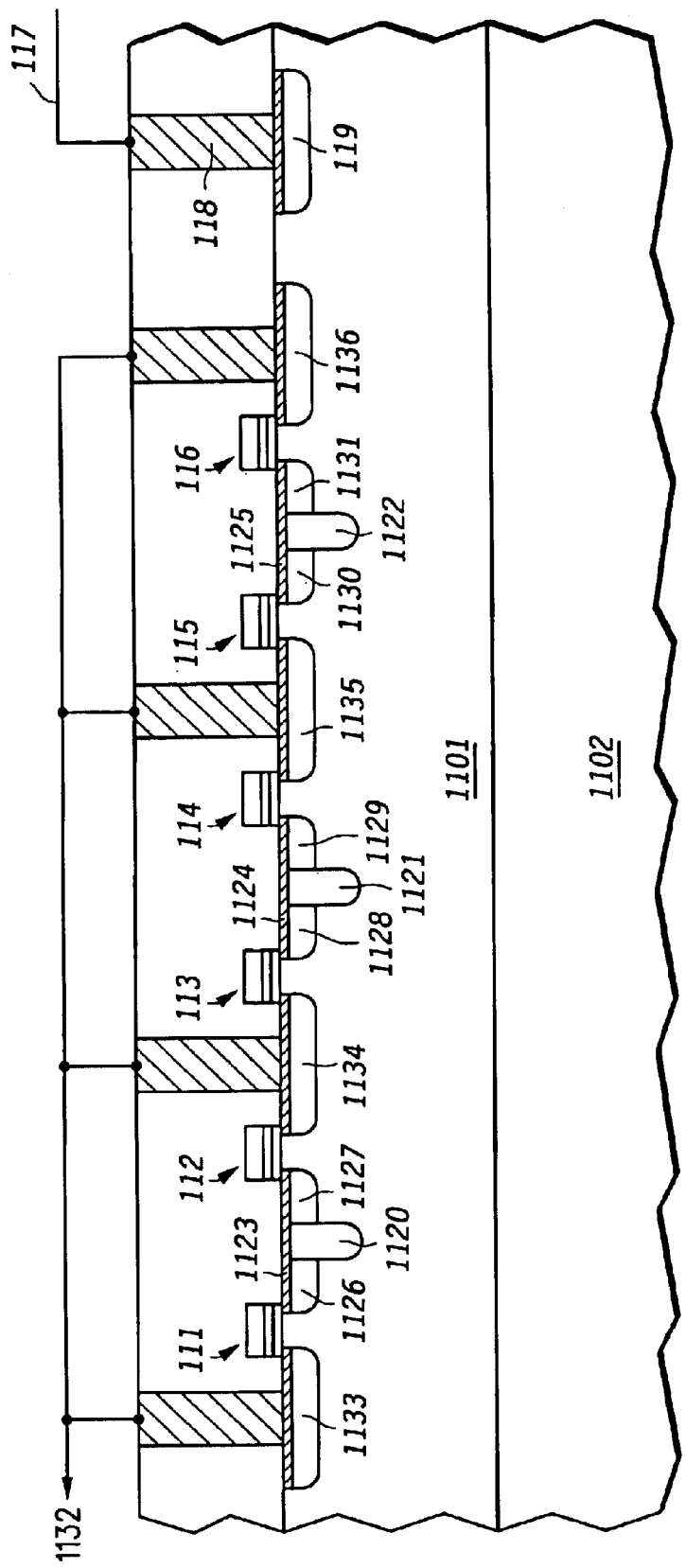
FIG. 11 includes an illustration of a cross-section of an alternative embodiment of a semiconductor device having the isolated p-well arrangement, and including a contactless source.

Referring to FIG. 11, a cross section of an alternate embodiment is disclosed in which the source regions of each of the memory cells in the isolated p-well are tied to an isolated p-well region via an electrical strap between each of the source regions and the isolated p-well region. In other words, the semiconductor device is devoid of conductive source lines that electrically couple to each source region.

This embodiment advantageously eliminates a need to form a source interconnect and contacts that electrically couples to the source regions of each of the memory cells, which can significantly reduce the memory cell size. Biasing of the memory cell source regions is accomplished by applying a potential to the isolated p-well region 1101 by way of an electrical interconnect 117, an electrical contact 118, and p-doped region 119. When the isolated p-well is biased at a desired potential, the source regions of each of the memory cells are correspondingly biased at a similar potential by way of the electrical ties (which include p-doped regions 1120, 1121, 1122 and silicided regions 1123, 1124, and 1125). In one embodiment, the n-type source regions 1126 and 1127, 1128 and 1129, 1130 and 1131 electrically couple to the isolated p-well region 1101 by way of the p-doped regions 1120, 1121, 1122, respectively. In accordance with one specific embodiment, the n-type source regions 1126 and 1127, 1128 and 1129, 1130 and 1131 are electrically shorted to the p-doped regions 1120, 1121, and 1122 by siliciding portions of the substrate 1123, 1124, and 1125 overlying the n-type source regions 1126 and 1127, 1128 and 1129, 1130 and 1131 and the p-doped regions 1120, 1121, and 1122 as shown in FIG. 11. In one embodiment, the siliciding portions are doped the same polarity as the well.

In accordance with one embodiment, a bitline 1132 is electrically connected to the drain regions 1133, 1134, 1135, 1136 of memory cells 111, 112, 113, 114, 115 and 116 and a deep n-well region 1102 is formed below the isolated p-well region 1101. One of ordinary skill in the art recognizes that other methods (instead of silicidation) can be used to electrically tie the isolated p-well region 1101 with the source regions 1126, 1127, 1128, 1129, 1130, and 1131. In this manner, the isolated p-well concepts discussed previously can be used for memory array programming. The device is programmed and erased in substantially a similar manner to that previously described with respect to FIGS. 10A–10E.

In the embodiments described above the memory cells 111–116, 311–316, 321–326, and 331–336 of FIGS. 3, 4 and 11 include floating gates. However, the memory cells 111–116, 311–316, 321–326, and 331–336 of FIGS. 3, 4 and 11 or a portion of them can be devoid of floating gates. Suitable memory cells that are devoid of floating gates include SONOS, SNOS, MONOS or MNOS devices and the like. A method of forming a SONOS device is described in regards to FIGS. 12–15. Modifications to the SONOS process flow to form SNOS, MONOS, or MNOS devices will also be described.

Figure 12:
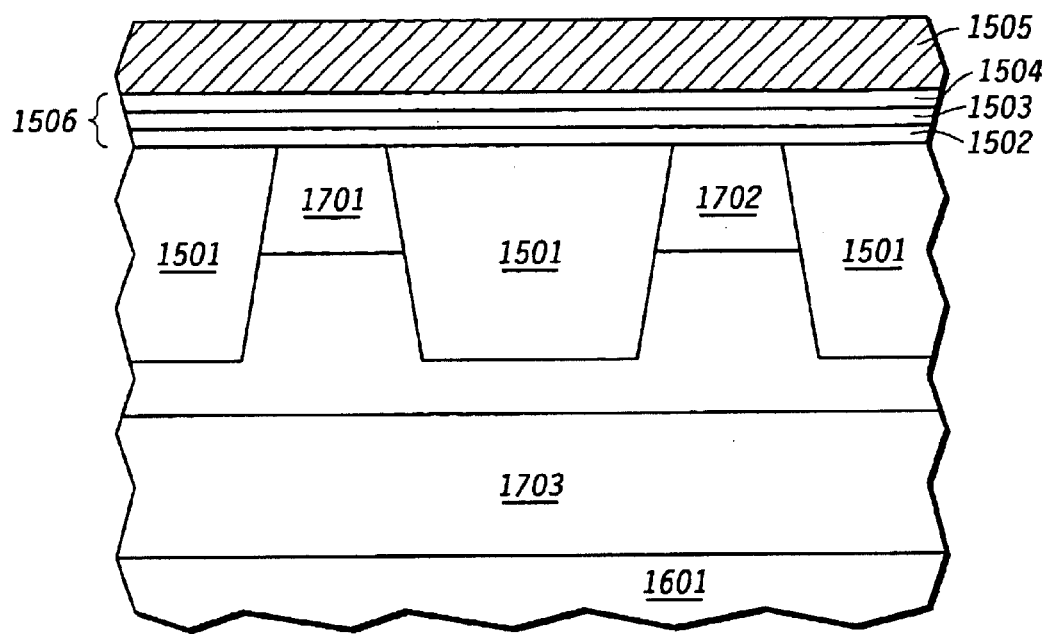
FIGS. 12–13 include cross-sectional illustrations showing a method of making a different type of memory cell in accordance with an alternate embodiment.

FIG. 12 is a cross-section across adjacent isolation regions 1501 and 1502, p-typed doped regions 1701 and 1702, and deep n-type doped region 1703, formed over semiconductor device substrate 1601. The isolation regions 1501 and 1502, the semiconductor device substrate 1601, the p-type doped regions 1701 and 1702 and the deep n-type doped region 1703 are the same as the isolation regions 501 and 502, the semiconductor device substrate 601, the p-type doped regions 701 and 702 and the deep n-type doped region 703 in FIG. 7. Thus, the processes for forming and characteristics of regions 1501, 1502, 1701, 1702, 1703, and 1601 as those previously disclosed for regions 501, 502, 701, 702, 703 and 601.

After forming the deep n-type doped region 1703, the processing to form a SONOS SNOS, MONOS, and MNOS devices deviates from the process previously discussed to form a floating gate device. To form a SONOS device, a tunnel dielectric layer 1502, a charge storage layer 1503, a blocking layer 1504 and a control gate 1505 are formed over the substrate surface as shown in FIG. 12.

In accordance with one embodiment, the tunnel dielectric layer 1502 is a thermally grown silicon dioxide layer. Alternatively, any dielectric that has a low trap density can be used. Other methods such as CVD, PVD (physical vapor deposition), ALD (atomic layer deposition), combinations of the above, or the like can be used to form the tunnel dielectric layer 1502. Preferably, the tunnel dielectric layer 1502 is 15–25 Angstroms in thickness to provide a layer thick enough to prevent charge leakage through the tunnel dielectric layer 1502.

The charge storage layer 1503 is a non-conductive layer that can store charge due to its high trap density and is formed over the tunnel dielectric layer 1502 by CVD, PVD, ALD, combinations of the above, or the like. The non-conductive charge storage layer 1503 can also be formed by implanting nitride into a dielectric material or any other process that results in a suitable non-conductive storage layer. One difference of SONOS, SNOS, MONOS and MNOS from floating gate devices is that the charge storage layer is a different material. For SONOS, SNOS, MONOS and MNOS the charge storage layer is a non-conductive material and for floating gate devices the charge storage layer is a semiconductive material. In one embodiment, the non-conductive charge storage layer 1503 of memory cells devoid of floating gates is a nitride, such as silicon nitride or silicon oxynitride formed by LPCVD (low pressure chemical vapor deposition). Silicon oxynitride may be preferred over silicon nitride, because this material may have deeper trap energy levels despite having fewer traps than silicon nitride. Thus, the trapping density of silicon oxynitride may supercede that of silicon nitride. Preferably, the non-conductive charge storage layer 1503 is 50–150 Angstroms in thickness.

Formed over the charge storage layer 1503, the blocking layer 1504 can be any dielectric mentioned for the tunnel dielectric layer 1502; the materials need not be the same. Also, the same processes can be used to form the blocking layer 1504 and the tunnel dielectric layer 1502. The blocking layer 1504 prevents charge, preferably electrons, from traveling from the overlying control electrode to the charge storage layer 1503. In one embodiment, the blocking layer 1504 is a high temperature oxide (HTO) deposited by LPCVD. The blocking layer 1504 can also be formed by steam re-oxidation of the charge storage layer 1503. A steam re-oxidation of the charge storage layer 1503 converts part of the charge storage layer 1503 to an oxide layer when the steam (H$_2$O) reacts with the charge storage layer 1503. A skilled artisan recognizes that the ability to use steam re-oxidation depends on the material chosen for the charge storage layer 1503. For example, if the charge storage layer 1503 is silicon nitride, steam re-oxidation can be used to form silicon dioxide to serve as the blocking layer 1504. In a preferred embodiment, the blocking layer 1504 is thicker than the tunnel dielectric layer 1502 and is 30–100 Angstroms in thickness.

The tunnel dielectric layer 1502, the non-conductive charge storage layer 1503 and the blocking layer 1504 form an ONO (oxide-nitride-oxide) stack 1506. Again, the non-conductive charge storage layer 1503 need not be a nitride but since it usually is the phrase "nitride" is chosen in the ONO acronym. Similarly, the "oxide" layers need not be an oxide and instead can be any suitable dielectric. The reference to the tunnel dielectric layer 1502, the non-conductive charge storage layer 1503, and the blocking layer 1504 as the ONO stack should not be construed as limiting the charge storage layer 1503 to nitride or the tunnel dielectric layer 1502 and blocking layer 1504 to oxide.

After forming the ONO stack 1506, it is patterned to remove the stack in some areas of the wafer, such as the area where a transistor or other periphery circuitry will be subsequently formed. All layers of the ONO stack 1506 can be patterned at the same time. Alternatively, although less efficient and more complex, each layer of the ONO stack 1506 can be patterned after its formation and prior to formation of overlying layers.

A control gate 1505 is formed over the blocking layer 1504. In one embodiment, the control gate 1505 is polysilicon formed by CVD, PVD, ALD, combinations of the above, or the like. Alternatively, any conducting or semiconductor material, such as a metal can be used. If the control gate 1505 is a semiconductor material, such as polysilicon, then the memory cell is a SONOS memory cell;, if the control gate 1505 is a metal then the memory cell is a MONOS memory cell. Areas of the control gate 1505 are removed in order for transistors and other periphery circuitry to be formed on areas of the semiconductor substrate 1601 that are not shown. A photoresist and conventional etch can be used for patterning the control gate 1505.

Figure 13:
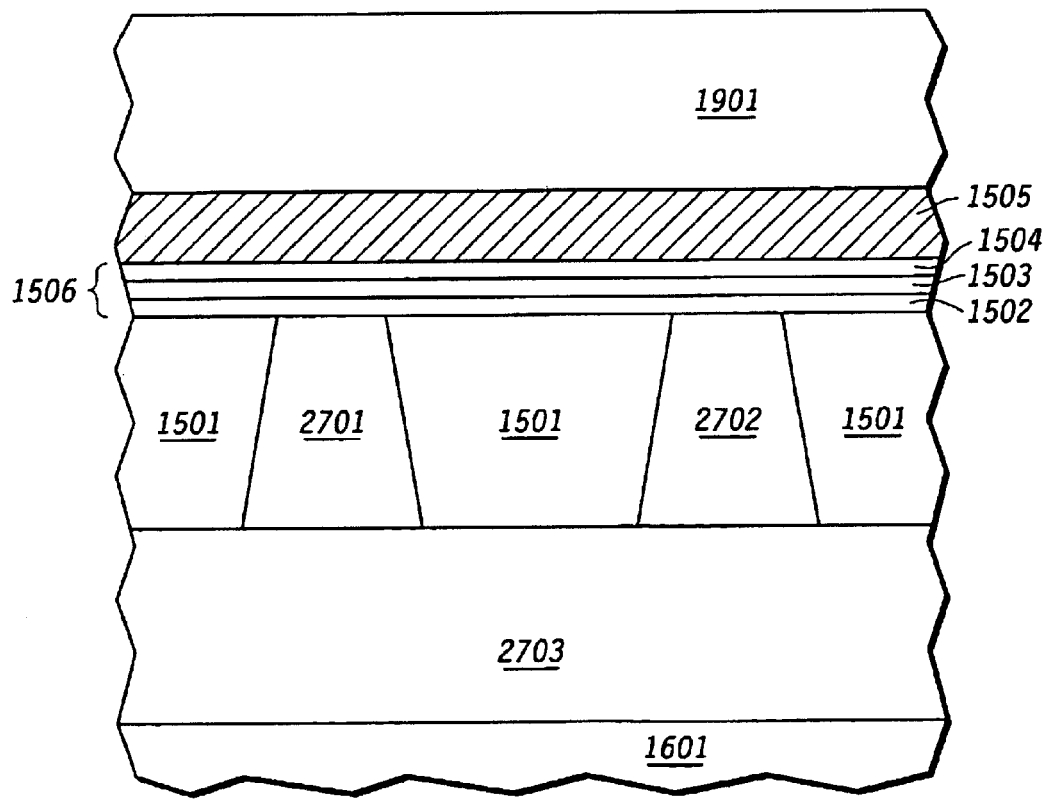

In accordance with one embodiment, the semiconductor substrate is then annealed using conventional annealing processes to diffuse and activate the dopants in the substrate 601 thereby forming the p-well regions 2701 and 2702 and the deep n-well region 2703, as shown in FIG. 13.

Thereafter, a second conductive layer (not shown) is deposited over the semiconductor substrate 1601, patterned and etched as desired to form the wordline 3071 in areas of the substrate 1601 not shown. The wordline 3071 also forms the control gates for the memory cells 311 and 321 and commonly connects the memory cells 311 and 321, as previously described in regards to FIG. 3.

As shown in FIG. 13, after the wordline 3071 (not shown) and other wordlines (not shown) are formed, an interlevel dielectric (ILD) layer 1901, such as a CVD silicon oxide, is formed over the ONO stack 1506 using, for example, tetraethoxysilane (TEOS) as a source gas, or another suitable gas. Although not shown in FIG. 14, subsequent processes in formation of the semiconductor device include formation of contacts and interconnects to other elements of the array.

A skilled artisan should recognize that the same advantages, conditions, and properties associated with the wells described in regards to FIGS. 5–7, such as the depth of the trenches, are the same as those in regards to FIGS. 12–13

As is apparent from the cross-section of FIG. 13, the p-well 2701 is isolated from the p-well 2702. It should be understood that because of the isolation biasing potentials of memory cells associated with the p-well 2701 are not necessarily the same as, and can be independent of, biasing potentials of memory cells associated with the p-well 2702. In other words, each separate p-well column is electrically isolated from other p-well columns in an array. The isolated p-wells 2701 and 2702 enable array programming in such manner as to achieve narrower distribution of threshold voltages, both at the low and the high threshold voltage levels.

The above process described in reference to FIGS. 12 and 13 to form a SONOS or MONOS device can be modified slightly to form a SNOS or MNOS device. When forming a SNOS or MNOS device the step of forming the blocking layer 1504 is eliminated. If the blocking layer is eliminated and the control gate 1505 is a semiconductor or a metal, the memory cell is a SNOS device or a MNOS device, respectively.

Figure 14:
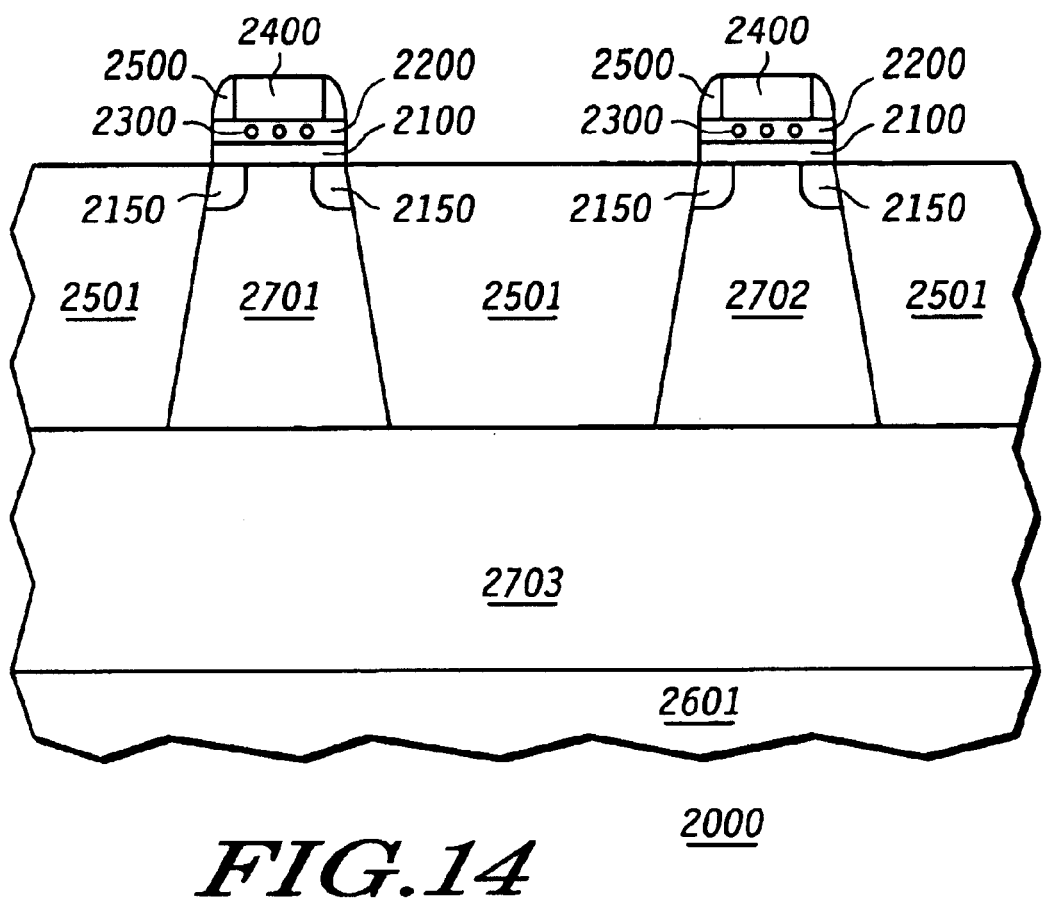
FIG. 14 includes a cross-sectional illustration of a memory cell in accordance with yet another embodiment of the present invention.

Alternatively, a quantum or nanocrystal device 2000 as illustrated in FIG. 14 can replace the floating gate, SONOS, SNOS, MONOS or MNOS memory cells in FIG. 3 or 11. The quantum device 2000 includes the isolation areas 2501, p-wells 2701 and 2702 formed over a semiconductor device substrate 2601, which are identical to and formed by the processes for corresponding structures in FIGS. 12–13. Within the p-wells 2701 and 2702 are the source and drain regions 2150 of the device. Lying over the p-wells 2701 and 2702, is a tunnel dielectric 2100, which can be any suitable dielectric, such as silicon dioxide, formed by thermal growth, CVD, PVD, ALD, the like, or combinations of the above. Discrete storage elements of nanocrystals 2300, which are semiconductor spheres or hemispheres that store the charges for the device, are formed over the tunnel dielectric 2100 by CVD of silicon, for example. Although three nanocrystals 2300 per device are shown in FIG. 14, any number of nanocrystals 2300 can be used.

A control dielectric 2200 is deposited over the nanocrystals 2300 by CVD, PVD, ALD, the like, or combinations of the above. Typically, the control dielectric 2200 is silicon dioxide; any other suitable dielectric material may be used. Over the control dielectric 2200, a control gate 2400 is formed and patterned. Spacers 2500, which are nitride and/or oxide, preferably silicon nitride and/or silicon dioxide, are formed by forming an insulating layer by CVD, PVD, ALD, the like, or combinations of the above, and subsequent isotropic etching the insulating layer. Additionally, nitride-containing layers can be formed over or under the nanocrystals 2300 to either prevent oxidation of the nanocrystals 2300 during formation of the control dielectric 2200 or improve nanocrystals 2300 formation, respectively.

The advantage of using nanocrystals 2300 to store charge compared to a continuous layer as is used in floating gate, SONOS, MONOS, SNOS or MNOS device, is that any defect in the underlying tunnel dielectric 2100 which causes charge to leak from the charge storage layer will only deplete a select nanocrystal(s) instead of the entire charge storage layer.

The advantages described in regards to the embodiments where the memory cells are floating devices are the same as the embodiments where the memory cells are devoid of floating devices. However, additional advantages are obtained when using a SONOS, SNOS, MONOS, MNOS, or like memory cell. Since less patterning steps are required than that needed to form floating gate memory cells, the processing complexity is reduced. Additionally, the program and erase voltages for SONOS, SNOS, MONOS, MNOS and the like memory cells scale more easily than floating gates, meaning the voltages reduce proportionately. The memory cell voltage scaling allows for lower voltages to be used in periphery devices and thus the scaling of the periphery devices.

Additional advantages of using a nanocrystal device includes the ability to thin the tunnel dielectric, which is a problem in floating gate devices and SONOS, SNOS, MONOS or MNOS device because a thin tunnel dielectric may increase device leakage.

The programming of the memory cells 111–116, 311–316, 321–326 and 331–336 if they are devoid of a floating gate is the same as that for floating gates, except the source, drain and well voltages may differ. Generally, the voltage used for programming and erasing memory cells devoid of a floating gate is less than that for memory cells with floating gates. A desirable program voltage range for SONOS, SNOS, MONOS and MNOS is +4 to +7 Volts, preferably +5 Volts, for the source, drain, and well voltage and −4 to −7 Volts, preferably −5V, for the control gate voltage. A desirable erase voltage range for SONOS, SNOS, MONOS and MNOS is −4 to −7 Volts, preferably −5 Volts, for the source, drain, and well voltage and +4 to +7 Volts, preferably +5 Volts, for the control gate voltage. Regardless of the voltage chosen, the magnitude of the voltages for the source, drain and well voltages should be the same. This allows for a source/well and drain/well bias difference of 0 volts during program and erase, which aids in aggressive channel length scaling. In addition, this programming and erase scheme substantially prevents disturb from lateral field enabled hole injection and virtually no substrate electron injection disturb since the channel and well are at the same potentials.

Although the invention has been described with respect to specific conductivity types or polarity of potentials, skilled artisans appreciate that conductivity types and polarities of potentials may be reversed. In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device having an electrically erasable programmable read only memory (BEPROM) array including rows and columns of memory cells comprising:
    a first well region and a second well region within a semiconductor substrate, wherein the first well region and the second well region are spaced apart and electrically isolated;
    a first column of memory cells positioned within the first well region;
    a second column of memory cells positioned within the second well region;
    a first tunnel dielectric of a first memory cell in the first column of memory cells and a second tunnel dielectric of a second memory cell in the second column of memory cells, wherein the first and second memory cells are devoid of floating gates;
    a first charge storage layer of the first memory cell formed over the first tunnel dielectric and a second charge storage layer of the second memory cell formed over the second tunnel dielectric;
    a first control gate of the first memory cell formed over the first charge storage layer and a second control gate of the second memory cell formed over the second charge storage layer, wherein the first control gate and the second control gate are in a same row and electrically coupled via a common wordline;
    a first bitline electrically coupled to drain regions of each memory cell in the first column of memory cells;
    a second bitline electrically coupled to drain regions of each memory cell in the second column of memory cells;
    a first source line electrically coupled to source regions of each memory cell in the first column of memory cells, wherein the first source line and a source region of at least one memory cell in the first column of memory cells are electrically coupled to the first well region; and
    a second source line electrically coupled to source regions of each memory cell in the second column of memory cells, wherein the second source line, and a source region of at least one memory cell in the second column of memory cells is electrically coupled to the second well region.

2. The semiconductor device of claim 1, wherein the first and second well regions are p-wells.

3. The semiconductor device of claim 1, wherein the first and second charge storage layers comprise nitrogen.

4. The semiconductor device of claim 3, wherein the fist and second charge storage layers are selected from the group consisting of silicon nitride and silicon oxynitride.

5. The semiconductor device of claim 1, further comprising:
    a first blacking layer of the first memory cell formed over the first charge storage layer and under the first control gate and a second blocking layer of the second memory cell formed over the second charge storage layer and under the first control gate.

6. The semiconductor device of claim 1, wherein the first well region and the second well region are spaced apart and electrically isolated by a trench isolation feature.

7. The semiconductor device of claim 6, further comprising a third well region below the shallow trench isolation feature that electrically isolates the first well region from the second well region, wherein the first and second well regions are a polaiity different than the third well region.

8. The semiconductor device of claim 1, wherein the first and second charge storage layers comprise discrete storage elements.

* * * * *